(12) United States Patent
Ziazadeh et al.

(10) Patent No.: US 7,135,902 B1
(45) Date of Patent: Nov. 14, 2006

(54) DIFFERENTIAL SIGNAL GENERATOR HAVING CONTROLLED SIGNAL RISE AND FALL TIMES WITH BUILT-IN TEST CIRCUITRY

(75) Inventors: Ramsin M. Ziazadeh, San Jose, CA (US); Varadarajan Devnath, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 77 days.

(21) Appl. No.: 10/907,965

(22) Filed: Apr. 22, 2005

(51) Int. Cl.
*H03L 7/06* (2006.01)
(52) U.S. Cl. ...................... 327/158; 327/161
(58) Field of Classification Search ............ None
See application file for complete search history.

(56) References Cited

U.S. PATENT DOCUMENTS

| 6,677,791 | B1* | 1/2004 | Okuda et al. | 327/158 |
| 6,759,881 | B1* | 7/2004 | Kizer et al. | 327/147 |
| 6,812,753 | B1* | 11/2004 | Lin | 327/155 |
| 6,819,626 | B1* | 11/2004 | Okuda et al. | 365/233 |
| 6,911,851 | B1* | 6/2005 | Sekiguchi et al. | 327/141 |
| 6,993,109 | B1* | 1/2006 | Lee et al. | 375/376 |

* cited by examiner

*Primary Examiner*—Timothy P. Callahan
*Assistant Examiner*—Cassandra Cox
(74) *Attorney, Agent, or Firm*—Vedder, Price, Kaufman & Kammholz (57) ABSTRACT

Integrated differential data signal generator circuitry for providing differential data signals with controlled rise and fall times and built-in test capabilities.

19 Claims, 4 Drawing Sheets

DIFFERENTIAL SIGNAL GENERATOR HAVING CONTROLLED SIGNAL RISE AND FALL TIMES WITH BUILT-IN TEST CIRCUITRY

BACKGROUND OF THE INVENTION

The present invention relates to differential signal generator circuits, and in particular, to differential signal generator circuits having controlled signal rise and fall times.

As the density of a typical integrated circuit (IC), or chip, continues to increase, increasing numbers of complex circuit functions are being integrated into each single chip. As the prices for such chips have declined, sometimes dramatically, this has become increasingly problematic from the standpoint of production costs, since such increasingly complex chips become more difficult and often, therefore, more costly to adequately test for defects. As a result, it has become increasingly common for chips to include some form of built-in system test (BIST) circuitry for performing internal testing of various portions of the integrated circuit to provide some form of output status signals indicative of any defects or performance problems. This advantageously allows for the use of simpler and typically less costly external automatic test equipment (ATE), as well as reduced testing times.

SUMMARY OF THE INVENTION

In accordance with the presently claimed invention, integrated differential data signal generator circuitry for providing differential data signals with controlled rise and fall times and built-in test capabilities is provided.

In accordance with one embodiment of the presently claimed invention, an integrated circuit with differential signal generator circuitry for providing at least one differential data signal with controlled rise and fall times and with built-in test circuitry therefor includes: a clock electrode via which is conveyed a data clock signal having a frequency; one or more data electrodes via which are conveyed one or more respective data signals; delay lock loop (DLL) circuitry; signal selection circuitry; signal delay circuitry; latching circuitry; signal conversion circuitry; and frequency comparison circuitry. The DLL circuitry is coupled to the clock electrode and responsive to the data clock signal by generating a DLL signal substantially synchronous with the data clock signal, and by providing one or more delay control signals having respective magnitudes related to the data clock signal frequency. The signal selection circuitry is coupled to the clock electrode and responsive to a test control signal, a feedback signal having a frequency, and the data clock signal by conveying, as a selected signal, one of the feedback and data clock signals. The signal delay circuitry is coupled to the DLL circuitry and the signal selection circuitry, and responsive to at least one of the one or more delay control signals and the selected signal by providing, substantially synchronous with the selected signal, the feedback signal and a plurality of sequentially delayed clock signals having a frequency. The latching circuitry is coupled to the signal delay circuitry and one of the one or more data electrodes, and responsive to a portion of the plurality of sequentially delayed clock signals and one of the one or more respective data signals by providing a plurality of latched signals having respective magnitudes related to the plurality of sequentially delayed clock signals and the one of the one or more respective data signals. The signal conversion circuitry is coupled to the latching circuitry and responsive to the plurality of latched signals by providing a differential data signal corresponding to the one of the one or more respective data signals and having signal rise and fall times related to the plurality of sequentially delayed clock signals. The frequency comparison circuitry is coupled to the clock electrode and the signal delay circuitry, and responsive to the data clock signal and one of the plurality of sequentially delayed clock signals by providing a test signal indicative of a difference between the data clock and delayed clock signal frequencies.

In accordance with another embodiment of the presently claimed invention, an integrated circuit with differential signal generator circuitry for providing at least one differential data signal with controlled rise and fall times and with built-in test circuitry therefor includes: delay lock loop (DLL) means; signal selector means; signal delay means; latching means; signal converter means; and frequency comparison means. The DLL means is for receiving a data clock signal having a frequency and in response thereto generating a DLL signal substantially synchronous with the data clock signal, and providing one or more delay control signals having respective magnitudes related to the data clock signal frequency. The signal selector means is for receiving a test control signal in response thereto selecting one of a feedback signal having a frequency and the data clock signal to convey as a selected signal. The signal delay means is for receiving at least one of the one or more delay control signals and the selected signal and in response thereto providing, substantially synchronous with the selected signal, the feedback signal and a plurality of sequentially delayed clock signals having a frequency. The latching means is for receiving a portion of the plurality of sequentially delayed clock signals and in response thereto latching one of the one or more respective data signals to provide a plurality of latched signals having respective magnitudes related to the plurality of sequentially delayed clock signals and the one of the one or more respective data signals. The signal converter means is for converting the plurality of latched signals to a differential data signal corresponding to the one of the one or more respective data signals and having signal rise and fall times related to the plurality of sequentially delayed clock signals. The frequency comparison means is for comparing the data clock signal and one of the plurality of sequentially delayed clock signals to provide a test signal indicative of a difference between the data clock and delayed clock signal frequencies.

In accordance with another embodiment of the presently claimed invention, an integrated circuit with differential signal generator circuitry for providing at least one differential data signal with controlled rise and fall times and with built-in test circuitry therefore includes: a clock electrode via which is conveyed a data clock signal having a frequency; one or more data electrodes via which are conveyed one or more respective data signals; delay lock loop (DLL) circuitry; signal selection circuitry; signal delay circuitry; latching circuitry; signal conversion circuitry; and signal peak detection circuitry. The DLL circuitry is coupled to the clock electrode and responsive to the data clock signal by generating a DLL signal substantially synchronous with the data clock signal, and by providing one or more delay control signals having respective magnitudes related to the data clock signal frequency. The signal selection circuitry is coupled to the clock electrode and responsive to a test control signal, a feedback signal having a frequency, and the data clock signal by conveying, as a selected signal, one of the feedback and data clock signals. The signal delay circuitry is coupled to the DLL circuitry and the signal selection circuitry, and responsive to at least one of the one or more delay control signals and the selected signal by providing, substantially synchronous with the selected signal, the feedback signal and a plurality of sequentially delayed clock signals having a frequency. The latching circuitry is coupled to the signal delay circuitry and one of the one or more data electrodes, and responsive to a portion of the plurality of sequentially delayed clock signals and one of the one or more respective data signals by providing a plurality of latched signals having respective magnitudes related to the plurality of sequentially delayed clock signals and the one of the one or more respective data signals. The signal conversion circuitry is coupled to the latching circuitry and responsive to the plurality of latched signals by providing a differential data signal corresponding to the one of the one or more respective data signals and having signal rise and fall times related to the plurality of sequentially delayed clock signals. The signal peak detection circuitry is coupled to the signal conversion circuitry and responsive to the differential data signal by providing a test signal indicative of a peak magnitude of the differential data signal.

In accordance with another embodiment of the presently claimed invention, an integrated circuit with differential signal generator circuitry for providing at least one differential data signal with controlled rise and fall times and with built-in test circuitry therefor includes: delay lock loop (DLL) means; signal selector means; signal delay means; latching means; signal converter means; and signal peak detector means. The DLL means is for receiving a data clock signal having a frequency and in response thereto generating a DLL signal substantially synchronous with the data clock signal, and providing one or more delay control signals having respective magnitudes related to the data clock signal frequency. The signal selector means is for receiving a test control signal in response thereto selecting one of a feedback signal having a frequency and the data clock signal to convey as a selected signal. The signal delay means is for receiving at least one of the one or more delay control signals and the selected signal and in response thereto providing, substantially synchronous with the selected signal, the feedback signal and a plurality of sequentially delayed clock signals having a frequency. The latching means is for receiving a portion of the plurality of sequentially delayed clock signals and in response thereto latching one of the one or more respective data signals to provide a plurality of latched signals having respective magnitudes related to the plurality of sequentially delayed clock signals and the one of the one or more respective data signals. The signal converter means is for converting the plurality of latched signals to a differential data signal corresponding to the one of the one or more respective data signals and having signal rise and fall times related to the plurality of sequentially delayed clock signals. The signal peak detector means is for detecting a peak signal magnitude of the differential data signal to provide a test signal indicative of the peak differential data signal magnitude.

In accordance with another embodiment of the presently claimed invention, an integrated circuit with differential signal generator circuitry for providing at least one differential data signal with controlled rise and fall times and with built-in test circuitry therefore includes: a clock electrode via which is conveyed a data clock signal having a frequency; one or more data electrodes via which are conveyed one or more respective data signals; delay lock loop (DLL) circuitry; signal selection circuitry; signal delay circuitry; latching circuitry; signal conversion circuitry; frequency comparison circuitry; and signal peak detection circuitry.

The DLL circuitry is coupled to the clock electrode and responsive to the data clock signal by generating a DLL signal substantially synchronous with the data clock signal, and by providing one or more delay control signals having respective magnitudes related to the data clock signal frequency. The signal selection circuitry is coupled to the clock electrode and responsive to a test control signal, a feedback signal having a frequency, and the data clock signal by conveying, as a selected signal, one of the feedback and data clock signals. The signal delay circuitry is coupled to the DLL circuitry and the signal selection circuitry, and responsive to at least one of the one or more delay control signals and the selected signal by providing, substantially synchronous with the selected signal, the feedback signal and a plurality of sequentially delayed clock signals having a frequency. The latching circuitry is coupled to the signal delay circuitry and one of the one or more data electrodes, and responsive to a portion of the plurality of sequentially delayed clock signals and one of the one or more respective data signals by providing a plurality of latched signals having respective magnitudes related to the plurality of sequentially delayed clock signals and the one of the one or more respective data signals. The signal conversion circuitry is coupled to the latching circuitry and responsive to the plurality of latched signals by providing a differential data signal corresponding to the one of the one or more respective data signals and having signal rise and fall times related to the plurality of sequentially delayed clock signals. The frequency comparison circuitry is coupled to the clock electrode and the signal delay circuitry, and responsive to the data clock signal and one of the plurality of sequentially delayed clock signals by providing a test signal indicative of a difference between the data clock and delayed clock signal frequencies. The signal peak detection circuitry is coupled to the signal conversion circuitry and responsive to the differential data signal by providing a test signal indicative of a peak magnitude of the differential data signal.

In accordance with another embodiment of the presently claimed invention, an integrated circuit with differential signal generator circuitry for providing at least one differential data signal with controlled rise and fall times and with built-in test circuitry therefor includes: delay lock loop (DLL) means; signal selector means; signal delay means; latching means; signal converter means; frequency comparison means; and signal peak detector means. The DLL means is for receiving a data clock signal having a frequency and in response thereto generating a DLL signal substantially synchronous with the data clock signal, and providing one or more delay control signals having respective magnitudes related to the data clock signal frequency. The signal selector means is for receiving a test control signal in response thereto selecting one of a feedback signal having a frequency and the data clock signal to convey as a selected signal. The signal delay means is for receiving at least one of the one or more delay control signals and the selected signal and in response thereto providing, substantially synchronous with the selected signal, the feedback signal and a plurality of sequentially delayed clock signals having a frequency. The latching means is for receiving a portion of the plurality of sequentially delayed clock signals and in response thereto latching one of the one or more respective data signals to provide a plurality of latched signals having respective magnitudes related to the plurality of sequentially delayed clock signals and the one of the one or more respective data signals. The signal converter means is for converting the plurality of latched signals to a differential data signal corresponding to the one of the one or more respective data signals and having signal rise and fall times related to the plurality of sequentially delayed clock signals. The frequency comparison means is for comparing the data clock signal and one of the plurality of sequentially delayed clock signals to provide a test signal indicative of a difference between the data clock and delayed clock signal frequencies. The signal peak detector means is for detecting a peak signal magnitude of the differential data signal to provide a test signal indicative of the peak differential data signal magnitude.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 1A:
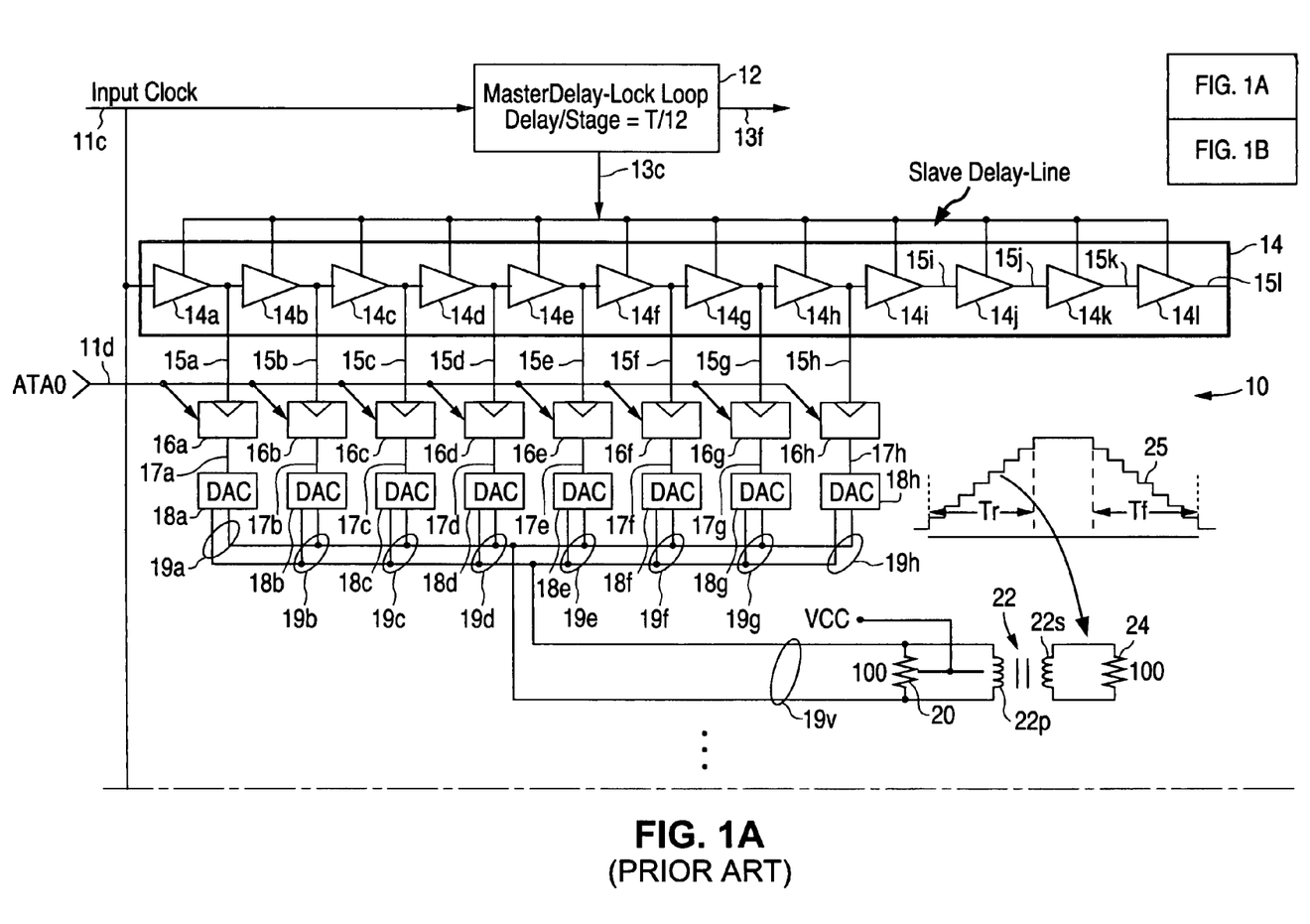
FIG. 1A, 1B is a schematic diagram of conventional differential signal generator circuitry for generating differential signals having controlled rise and fall times.
Figure 1B:
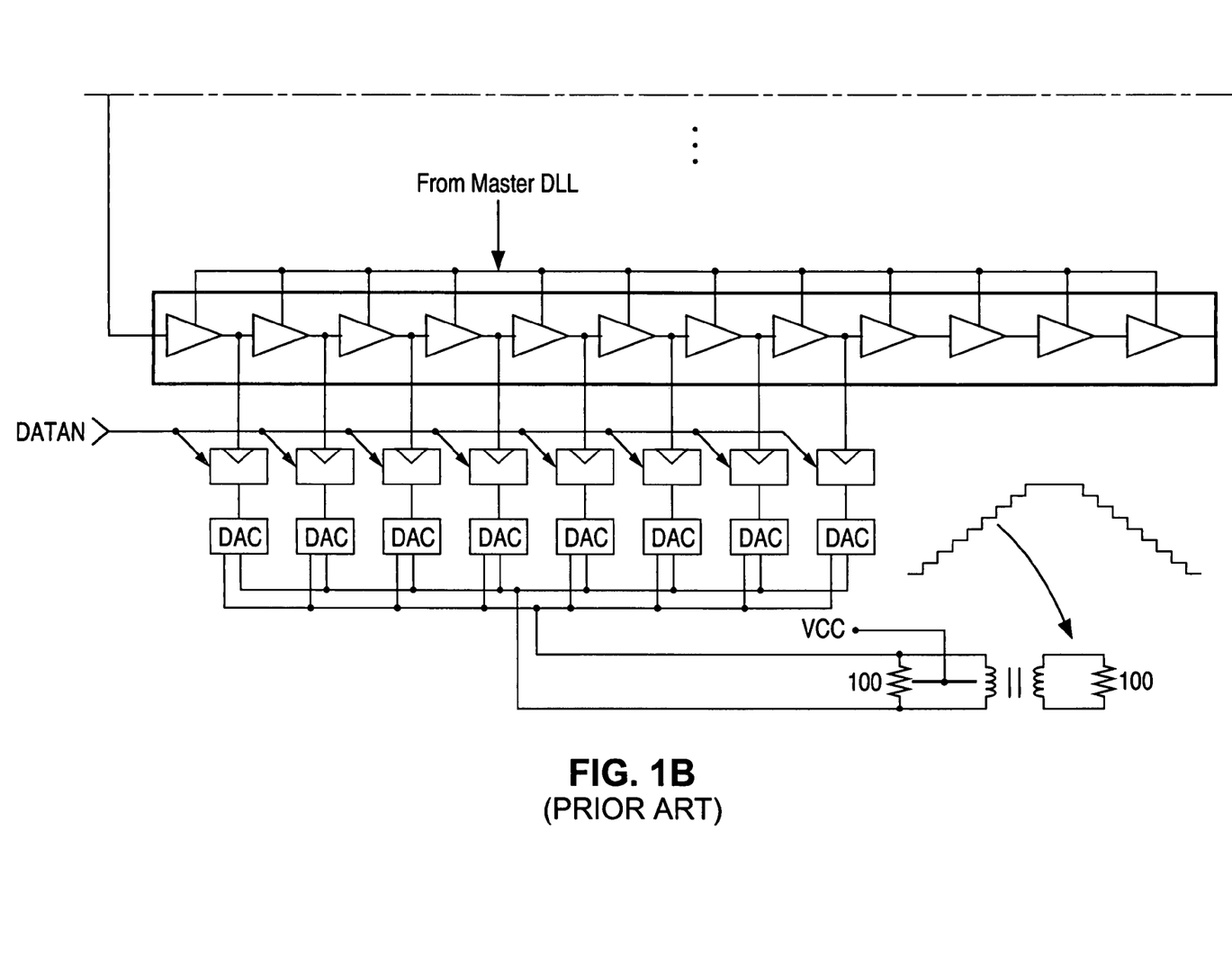

Referring to FIG. 1, an integrated circuit with multiple conventional differential signal generator circuits 10 for providing differential output signals with controlled rise and fall times include a master delay lock loop (DLL) stage 12 and multiple differential signal generator stages 10. The master delay lock loop 12 operates in a conventional and well-known manner to generate a DLL signal 13f which is substantially synchronous with the incoming clock signal 11c. Such a DLL 12 includes multiple (e.g., 12) serially coupled delay stages. In accordance with well-known DLL circuit principles, the DLL stage 12 generates a control signal 13c for use as the master control signal for the multiple slave delay lines 14. Similarly, each slave delay line 14 includes multiple (e.g., 12) serially coupled delay stages (e.g., inverter circuits 14a, 14b, . . . , 14l), all interconnected substantially as shown. Such inverter circuits 14 as delay stages can be implemented in a number of conventional ways, such as current-starved delay lines in which voltage-controlled resistors are included in the individual inverter circuits, or capacitor-loaded delay lines with capacitance discharge times dependent upon the control voltage 13c.

These delay line stages 14a, 14b, . . . , 14l produce corresponding sequentially delayed signals 15a, 15b, . . . , 15l. In one example embodiment, only the first eight delayed signals 15a, 15b, . . . , 15h are used. These signals 15a, 15b, . . . , 15h are used as clock signals for latching circuits 16a, 16b, . . . , 16h (e.g., D-type flip-flops) for latching the incoming data signal 11D. This produces a corresponding number of digital latched signals 17a, 17b, . . . , 17h, which are converted to analog signals by respective digital-to-analog converter (DAC) circuits 18a, 18b, . . . , 18h. These DAC circuits 18a, 18b, . . . , 18h produce corresponding analog signals 19a, 19b, . . . , 19h in the form of analog currents which sum together in output circuitry, including a load resistor 20, to produce an output differential signal 19v in the form of a differential voltage. This voltage appears across a load resistor 20 and the primary side 22p of an isolation transformer 22, the secondary side 22s of which drives an external load resistance 24.

As will be readily recognized by one of ordinary skill in the art, due to the sequential time delay associated with each of the delay line clock signals 15a, 15b, . . . , 15h, the two logic states of the digital data signal 11D become latched at sequential points in time by the latch circuits 16a, 16b, . . . , 16h. This results in similar sequentially delayed differential output current signals 19a, 19b, . . . , 19h contributing to produce the differential voltage signal 19v. Hence, such a voltage signal appears as a stepped voltage waveform 25. Accordingly, the rise Tr and fall Tf times of the output voltage waveform 25 can be controlled.

Figure 2A:
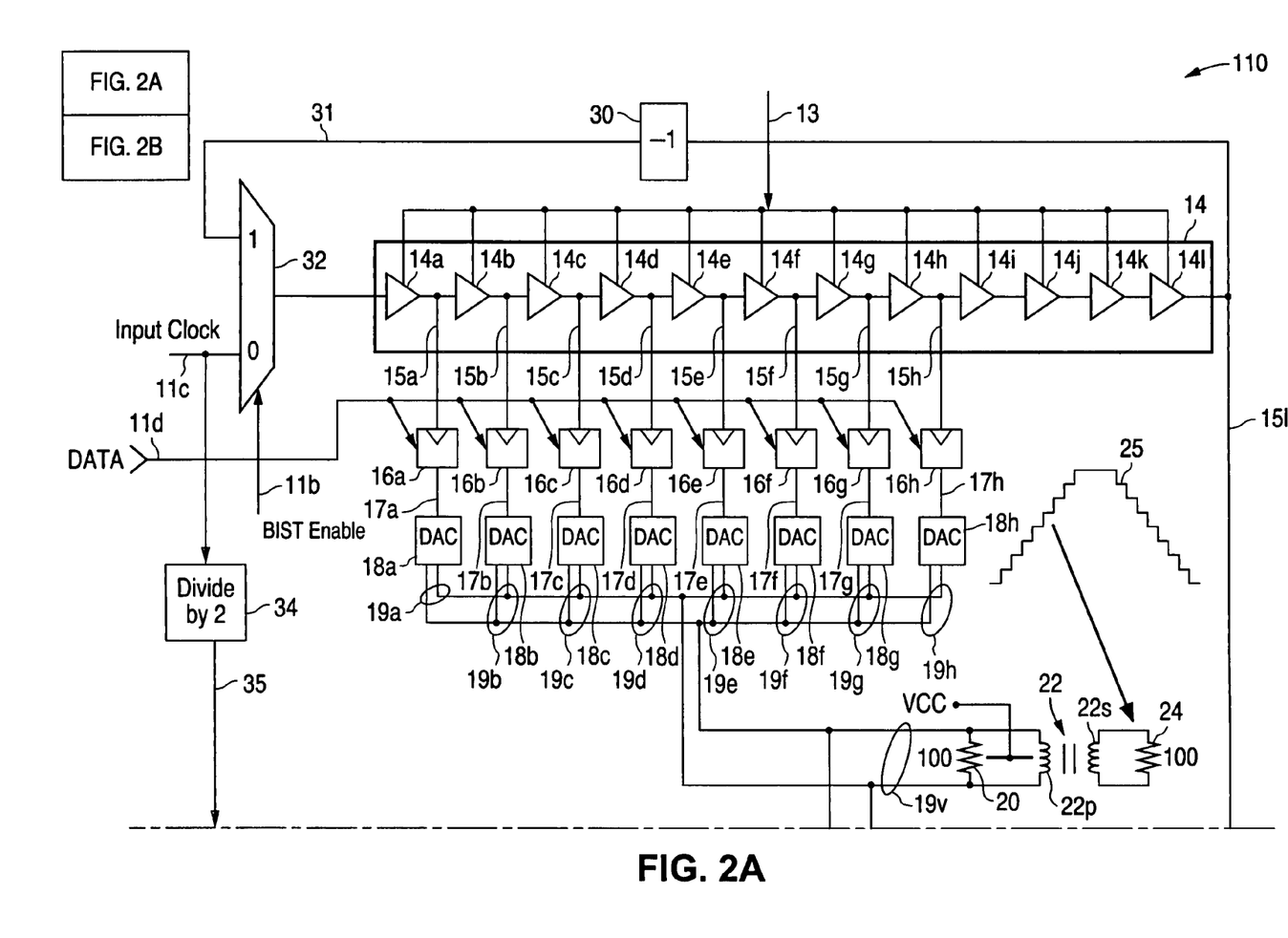
FIG. 2A, 2B is a schematic diagram of a differential signal generator circuit for providing differential signals with controlled signal rise and fall times with built-in test circuitry in accordance with one embodiment of the presently claimed invention.
Figure 2B:
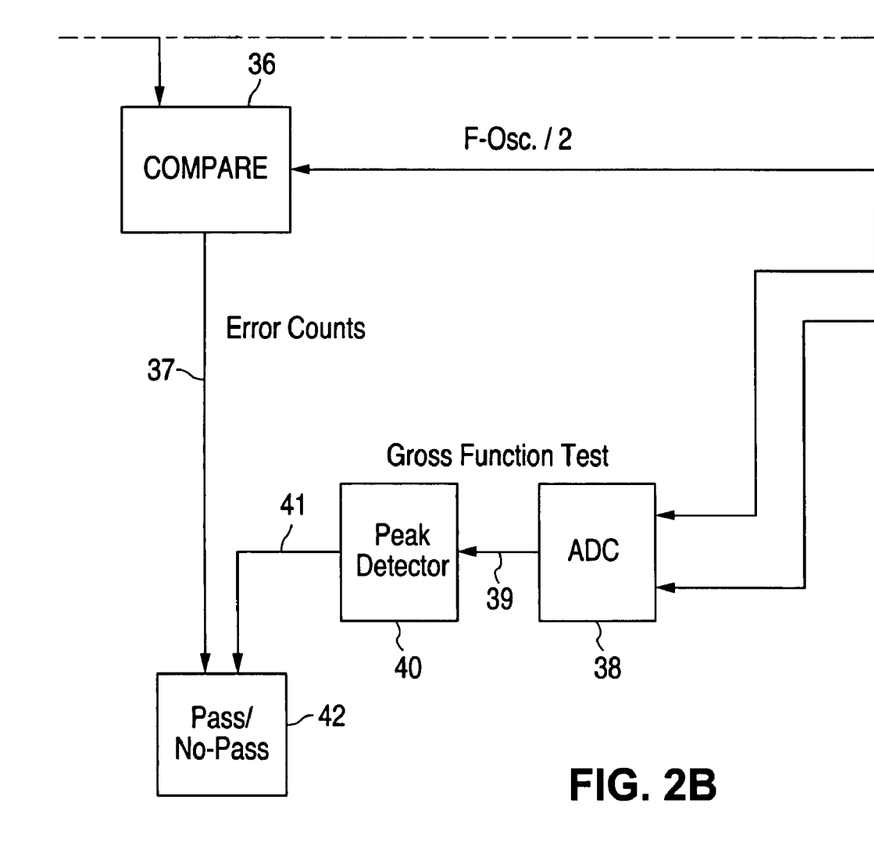

Referring to FIG. 2, built-in system test (BIST) circuitry can be added to allow simple functional tests to be performed to ensure that the output differential signal rise Tr and fall Tf times, as well as the peak-to-peak magnitude of the output differential signal, are correct.

Included as part of the BIST circuitry, in various combinations, are a feedback inverter circuit 30, a signal selector 32 (e.g., a switch or multiplexor), a frequency divider circuit 34, a frequency comparison circuit 36, an analog-to-digital converter (ADC) circuit 38, a signal peak detector 40, and a decision circuit 42, all interconnected substantially as shown. During performance of the built-in test functions, a BIST enable signal 11b is asserted which prevents the incoming clock signal 11c from driving the delay line 14. Instead, a feedback signal 31, which is an inverted form of the final delayed output signal 15l, is the selected signal conveyed to the input of the delay line 14, thereby causing the delay line 14 to now be part of a DLL oscillator circuit. Since the individual delay line stages 14a, 14b, . . . , 14l are controlled by the control signal 13 from the master DLL circuit 12, as discussed above, the resulting output oscillation signal 15l will be substantially synchronous with the signal 13f generated by the master DLL circuit 12 which, in turn, is synchronous with the incoming clock signal 11c. Ideally, the frequency of this oscillation output signal 15l is equal to one half of the frequency of the clock signal 11c.

This oscillation output signal 15l is provided to the frequency comparison circuit 36 for comparison with the input clock signal 11c. The input clock signal 11c can be divided in half by the frequency divider 34, thereby providing a reference signal 35 which should, ideally, be equal to the oscillation signal 15*l*. The frequency comparison circuit 36 (discussed in more detail below) compares the frequencies of these two signals 15*l*, 35, and produces a test signal 37 indicative of the difference, if any, in frequency between these two signals 15*l*, 35. Preferably, this test signal 37 would be in digital form for analysis or processing by the decision circuitry 42.

Additionally, BIST for testing the amplitude of the differential output voltage 19*v* can be performed using the ADC circuit 38 and peak detector 40 as follows. The differential output signal voltage 19*v* is converted by the ADC circuit 38 to a digital signal 39 (which can be provided in serial or parallel form, as desired). The peak detector 40, preferably implemented in digital form, "measures" the digital signal 39 by monitoring its numerical value. The maximum numerical value (e.g., irrespective of sign or polarity) of the digital signal 39 is captured and provided as an output signal 41 to the decision circuitry 42.

As a result, the decision circuitry 42, by monitoring the frequency comparison test signal 37 and peak detection test signal 41, can determine whether the rise and fall times, as well as the magnitude, of the differential output signal are within acceptable ranges.

Often, such BIST functionality can be added with minimal cost in terms of additional circuitry or complexity. For example, a number of the BIST circuit elements, such as the ADC circuit 38 and peak detector 40, are often available on-chip for shared use after already having been included for other circuit purposes within the chip.

Figure 3:
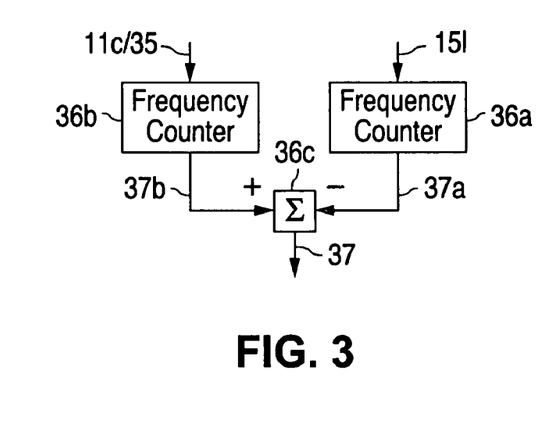
FIG. 3 is a block diagram of one example embodiment of the signal comparison circuit of FIG. 2.

Referring to FIG. 3, the frequency comparison circuit 36 can be implemented using two frequency counters 36*a*, 36*b* and a summing circuit 36*c*, interconnected substantially as shown. As discussed above, the oscillation signal 15*l* and frequency divided clock signal 35 have their respective frequencies counted, thereby producing corresponding frequency count data 37*a*, 37*b* which are differentially summed in the summing circuit 36*c* by subtracting one count from the other. This produces the test signal 37 indicative of a difference, if any, in the frequencies of the two input signals 15*l*, 35. Alternatively, the frequency divider 34 (FIG. 2) can be omitted, with the corresponding frequency counter 36*b* then being used to perform an additional frequency division as needed.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an integrated circuit with differential signal generator circuitry for providing at least one differential data signal with controlled rise and fall times and with built-in test circuitry therefor, comprising:

a clock electrode via which is conveyed a data clock signal having a frequency;

one or more data electrodes via which are conveyed one or more respective data signals;

delay lock loop (DLL) circuitry coupled to said clock electrode and responsive to said data clock signal by generating a DLL signal substantially synchronous with said data clock signal, and by providing one or more delay control signals having respective magnitudes related to said data clock signal frequency;

signal selection circuitry coupled to said clock electrode and responsive to a test control signal, a feedback signal having a frequency, and said data clock signal by conveying, as a selected signal, one of said feedback and data clock signals;

signal delay circuitry coupled to said DLL circuitry and said signal selection circuitry, and responsive to at least one of said one or more delay control signals and said selected signal by providing, substantially synchronous with said selected signal, said feedback signal and a plurality of sequentially delayed clock signals having a frequency;

latching circuitry coupled to said signal delay circuitry and one of said one or more data electrodes, and responsive to a portion of said plurality of sequentially delayed clock signals and one of said one or more respective data signals by providing a plurality of latched signals having respective magnitudes related to said plurality of sequentially delayed clock signals and said one of said one or more respective data signals;

signal conversion circuitry coupled to said latching circuitry and responsive to said plurality of latched signals by providing a differential data signal corresponding to said one of said one or more respective data signals and having signal rise and fall times related to said plurality of sequentially delayed clock signals; and frequency comparison circuitry coupled to said clock electrode and said signal delay circuitry, and responsive to said data clock signal and one of said plurality of sequentially delayed clock signals by providing a test signal indicative of a difference between said data clock and delayed clock signal frequencies.

2. The apparatus of claim 1, wherein said signal delay circuitry comprises a plurality of serially coupled analog signal delay circuits, wherein each one of at least a portion of said plurality of serially coupled analog signal delay circuits is coupled to said DLL circuitry and responsive to said at least one of said one or more delay control signals by delaying a signal from a prior one of said plurality of serially coupled analog signal delay circuits to provide one of said plurality of sequentially delayed clock signals for a subsequent one of said plurality of serially coupled analog signal delay circuits.

3. The apparatus of claim 1, wherein said latching circuitry comprises a plurality of flip-flops each of which, in response to respective ones of said portion of said plurality of sequentially delayed clock signals, latches said one of said one or more respective data signals to provide a respective one of said plurality of latched signals.

4. The apparatus of claim 1, wherein said signal conversion circuitry comprises:

a plurality of digital-to-analog conversion circuits responsive to said plurality of latched signals by providing a plurality of corresponding analog differential signals; and summing circuitry coupled to said plurality of digital-to-analog conversion circuits and responsive to said plurality of corresponding analog differential signals by providing said differential data signal.

5. The apparatus of claim 1, wherein said frequency comparison circuitry comprises:

a first frequency counter circuit responsive to said data clock signal by providing first frequency count data corresponding to said data clock signal frequency;

a second frequency counter circuit responsive to said one of said plurality of sequentially delayed clock signals by providing second frequency count data corresponding to said delayed clock signal frequency; and data subtraction circuitry coupled to said first and second frequency count circuitries, and responsive to said first and second frequency count data by providing said test signal.

6. An apparatus including an integrated circuit with differential signal generator circuitry for providing at least one differential data signal with controlled rise and fall times and with built-in test circuitry therefor, comprising:

delay lock loop (DLL) means for receiving a data clock signal having a frequency and in response thereto generating a DLL signal substantially synchronous with said data clock signal, and providing one or more delay control signals having respective magnitudes related to said data clock signal frequency;

signal selector means for receiving a test control signal in response thereto selecting one of a feedback signal having a frequency and said data clock signal to convey as a selected signal;

signal delay means for receiving at least one of said one or more delay control signals and said selected signal and in response thereto providing, substantially synchronous with said selected signal, said feedback signal and a plurality of sequentially delayed clock signals having a frequency;

latching means for receiving a portion of said plurality of sequentially delayed clock signals and in response thereto latching one of said one or more respective data signals to provide a plurality of latched signals having respective magnitudes related to said plurality of sequentially delayed clock signals and said one of said one or more respective data signals;

signal converter means for converting said plurality of latched signals to a differential data signal corresponding to said one of said one or more respective data signals and having signal rise and fall times related to said plurality of sequentially delayed clock signals; and frequency comparison means for comparing said data clock signal and one of said plurality of sequentially delayed clock signals to provide a test signal indicative of a difference between said data clock and delayed clock signal frequencies.

7. An apparatus including an integrated circuit with differential signal generator circuitry for providing at least one differential data signal with controlled rise and fall times and with built-in test circuitry therefor, comprising:

a clock electrode via which is conveyed a data clock signal having a frequency;

one or more data electrodes via which are conveyed one or more respective data signals;

delay lock loop (DLL) circuitry coupled to said clock electrode and responsive to said data clock signal by generating a DLL signal substantially synchronous with said data clock signal, and by providing one or more delay control signals having respective magnitudes related to said data clock signal frequency;

signal selection circuitry coupled to said clock electrode and responsive to a test control signal, a feedback signal having a frequency, and said data clock signal by conveying, as a selected signal, one of said feedback and data clock signals;

signal delay circuitry coupled to said DLL circuitry and said signal selection circuitry, and responsive to at least one of said one or more delay control signals and said selected signal by providing, substantially synchronous with said selected signal, said feedback signal and a plurality of sequentially delayed clock signals having a frequency;

latching circuitry coupled to said signal delay circuitry and one of said one or more data electrodes, and responsive to a portion of said plurality of sequentially delayed clock signals and one of said one or more respective data signals by providing a plurality of latched signals having respective magnitudes related to said plurality of sequentially delayed clock signals and said one of said one or more respective data signals;

signal conversion circuitry coupled to said latching circuitry and responsive to said plurality of latched signals by providing a differential data signal corresponding to said one of said one or more respective data signals and having signal rise and fall times related to said plurality of sequentially delayed clock signals; and signal peak detection circuitry coupled to said signal conversion circuitry and responsive to said differential data signal by providing a test signal indicative of a peak magnitude of said differential data signal.

8. The apparatus of claim 7, wherein said signal delay circuitry comprises a plurality of serially coupled analog signal delay circuits, wherein each one of at least a portion of said plurality of serially coupled analog signal delay circuits is coupled to said DLL circuitry and responsive to said at least one of said one or more delay control signals by delaying a signal from a prior one of said plurality of serially coupled analog signal delay circuits to provide one of said plurality of sequentially delayed clock signals for a subsequent one of said plurality of serially coupled analog signal delay circuits.

9. The apparatus of claim 7, wherein said latching circuitry comprises a plurality of flip-flops each of which, in response to respective ones of said portion of said plurality of sequentially delayed clock signals, latches said one of said one or more respective data signals to provide a respective one of said plurality of latched signals.

10. The apparatus of claim 7, wherein said signal conversion circuitry comprises:

a plurality of digital-to-analog conversion circuits responsive to said plurality of latched signals by providing a plurality of corresponding analog differential signals; and summing circuitry coupled to said plurality of digital-to-analog conversion circuits and responsive to said plurality of corresponding analog differential signals by providing said differential data signal.

11. The apparatus of claim 7, wherein said signal peak detection circuitry comprises:

analog-to-digital conversion circuitry responsive to said differential data signal by providing an analog signal corresponding to said differential data signal; and digital signal peak detection circuitry coupled to said analog-to-digital conversion circuitry and responsive to said analog signal by providing, as said test signal, a digital signal indicative of a peak magnitude of said differential data signal.

12. An apparatus including an integrated circuit with differential signal generator circuitry for providing at least one differential data signal with controlled rise and fall times and with built-in test circuitry therefor, comprising:

delay lock loop (DLL) means for receiving a data clock signal having a frequency and in response thereto generating a DLL signal substantially synchronous with said data clock signal, and providing one or more delay control signals having respective magnitudes related to said data clock signal frequency;

signal selector means for receiving a test control signal in response thereto selecting one of a feedback signal having a frequency and said data clock signal to convey as a selected signal;

signal delay means for receiving at least one of said one or more delay control signals and said selected signal and in response thereto providing, substantially synchronous with said selected signal, said feedback signal and a plurality of sequentially delayed clock signals having a frequency;

latching means for receiving a portion of said plurality of sequentially delayed clock signals and in response thereto latching one of said one or more respective data signals to provide a plurality of latched signals having respective magnitudes related to said plurality of sequentially delayed clock signals and said one of said one or more respective data signals;

signal converter means for converting said plurality of latched signals to a differential data signal corresponding to said one of said one or more respective data signals and having signal rise and fall times related to said plurality of sequentially delayed clock signals; and signal peak detector means for detecting a peak signal magnitude of said differential data signal to provide a test signal indicative of said peak differential data signal magnitude.

13. An apparatus including an integrated circuit with differential signal generator circuitry for providing at least one differential data signal with controlled rise and fall times and with built-in test circuitry therefor, comprising:

a clock electrode via which is conveyed a data clock signal having a frequency;

one or more data electrodes via which are conveyed one or more respective data signals;

delay lock loop (DLL) circuitry coupled to said clock electrode and responsive to said data clock signal by generating a DLL signal substantially synchronous with said data clock signal, and by providing one or more delay control signals having respective magnitudes related to said data clock signal frequency;

signal selection circuitry coupled to said clock electrode and responsive to a test control signal, a feedback signal having a frequency, and said data clock signal by conveying, as a selected signal, one of said feedback and data clock signals;

signal delay circuitry coupled to said DLL circuitry and said signal selection circuitry, and responsive to at least one of said one or more delay control signals and said selected signal by providing, substantially synchronous with said selected signal, said feedback signal and a plurality of sequentially delayed clock signals having a frequency;

latching circuitry coupled to said signal delay circuitry and one of said one or more data electrodes, and responsive to a portion of said plurality of sequentially delayed clock signals and one of said one or more respective data signals by providing a plurality of latched signals having respective magnitudes related to said plurality of sequentially delayed clock signals and said one of said one or more respective data signals;

signal conversion circuitry coupled to said latching circuitry and responsive to said plurality of latched signals by providing a differential data signal corresponding to said one of said one or more respective data signals and having signal rise and fall times related to said plurality of sequentially delayed clock signals;

frequency comparison circuitry coupled to said clock electrode and said signal delay circuitry, and responsive to said data clock signal and one of said plurality of sequentially delayed clock signals by providing a test signal indicative of a difference between said data clock and delayed clock signal frequencies; and signal peak detection circuitry coupled to said signal conversion circuitry and responsive to said differential data signal by providing a test signal indicative of a peak magnitude of said differential data signal.

14. The apparatus of claim 13, wherein said signal delay circuitry comprises a plurality of serially coupled analog signal delay circuits, wherein each one of at least a portion of said plurality of serially coupled analog signal delay circuits is coupled to said DLL circuitry and responsive to said at least one of said one or more delay control signals by delaying a signal from a prior one of said plurality of serially coupled analog signal delay circuits to provide one of said plurality of sequentially delayed clock signals for a subsequent one of said plurality of serially coupled analog signal delay circuits.

15. The apparatus of claim 13, wherein said latching circuitry comprises a plurality of flip-flops each of which, in response to respective ones of said portion of said plurality of sequentially delayed clock signals, latches said one of said one or more respective data signals to provide a respective one of said plurality of latched signals.

16. The apparatus of claim 13, wherein said signal conversion circuitry comprises:

a plurality of digital-to-analog conversion circuits responsive to said plurality of latched signals by providing a plurality of corresponding analog differential signals; and summing circuitry coupled to said plurality of digital-to-analog conversion circuits and responsive to said plurality of corresponding analog differential signals by providing said differential data signal.

17. The apparatus of claim 13, wherein said frequency comparison circuitry comprises:

a first frequency counter circuit responsive to said data clock signal by providing first frequency count data corresponding to said data clock signal frequency;

a second frequency counter circuit responsive to said one of said plurality of sequentially delayed clock signals by providing second frequency count data corresponding to said delayed clock signal frequency; and data subtraction circuitry coupled to said first and second frequency count circuitries, and responsive to said first and second frequency count data by providing said test signal.

18. The apparatus of claim 13, wherein said signal peak detection circuitry comprises:

analog-to-digital conversion circuitry responsive to said differential data signal by providing an analog signal corresponding to said differential data signal; and digital signal peak detection circuitry coupled to said analog-to-digital conversion circuitry and responsive to said analog signal by providing, as said test signal, a digital signal indicative of a peak magnitude of said differential data signal.

19. An apparatus including an integrated circuit with differential signal generator circuitry for providing at least one differential data signal with controlled rise and fall times and with built-in test circuitry therefor, comprising:

delay lock loop (DLL) means for receiving a data clock signal having a frequency and in response thereto generating a DLL signal substantially synchronous with said data clock signal, and providing one or more delay control signals having respective magnitudes related to said data clock signal frequency;

signal selector means for receiving a test control signal in response thereto selecting one of a feedback signal having a frequency and said data clock signal to convey as a selected signal;

signal delay means for receiving at least one of said one or more delay control signals and said selected signal and in response thereto providing, substantially synchronous with said selected signal, said feedback signal and a plurality of sequentially delayed clock signals having a frequency;

latching means for receiving a portion of said plurality of sequentially delayed clock signals and in response thereto latching one of said one or more respective data signals to provide a plurality of latched signals having respective magnitudes related to said plurality of sequentially delayed clock signals and said one of said one or more respective data signals;

signal converter means for converting said plurality of latched signals to a differential data signal corresponding to said one of said one or more respective data signals and having signal rise and fall times related to said plurality of sequentially delayed clock signals;

frequency comparison means for comparing said data clock signal and one of said plurality of sequentially delayed clock signals to provide a test signal indicative of a difference between said data clock and delayed clock signal frequencies; and signal peak detector means for detecting a peak signal magnitude of said differential data signal to provide a test signal indicative of said peak differential data signal magnitude.

* * * * *